(12) United States Patent
Mazumder et al.

(10) Patent No.: US 8,665,663 B2
(45) Date of Patent: Mar. 4, 2014

(54) MEMORY CIRCUIT AND CONTROL METHOD THEREOF

(75) Inventors: Kallol Mazumder, Plano, TX (US); Scott E. Smith, Plano, TX (US)

(73) Assignee: Nanya Technology Corporation, Kueishan, Tao-Yuan Hsien (TW)

( * ) Notice: Subject to any disclaimer, the term of this patent is extended or adjusted under 35 U.S.C. 154(b) by 393 days.

(21) Appl. No.: 13/095,153

(22) Filed: Apr. 27, 2011

(65) Prior Publication Data

US 2012/0275238 A1 Nov. 1, 2012

(51) Int. Cl.
*G11C 7/22* (2006.01)
(52) U.S. Cl.
USPC ..................................... 365/233.1
(58) Field of Classification Search
CPC ........ G11C 7/22; G11C 7/222; G11C 7/1072; G11C 11/4076; G06F 1/04; G06F 1/10
USPC ............. 365/233.1, 233.12, 233.15; 713/322, 713/601
See application file for complete search history.

(56) References Cited

U.S. PATENT DOCUMENTS

| | | | | |
|---|---|---|---|---|
| 5,918,058 A | * | 6/1999 | Budd | 713/300 |
| 7,818,528 B2 | * | 10/2010 | Hughes | 711/167 |
| 8,095,699 B2 | * | 1/2012 | Garg et al. | 710/20 |
| 2002/0083355 A1 | * | 6/2002 | Clark et al. | 713/322 |
| 2003/0122582 A1 | * | 7/2003 | Samaan | 326/96 |
| 2004/0103330 A1 | * | 5/2004 | Bonnett | 713/322 |
| 2005/0134303 A1 | * | 6/2005 | Best et al. | 326/30 |
| 2007/0253262 A1 | * | 11/2007 | Oh et al. | 365/193 |
| 2009/0262588 A1 | * | 10/2009 | Vilangudipitchai et al. | 365/189.11 |

* cited by examiner

*Primary Examiner* — Douglas King
(74) *Attorney, Agent, or Firm* — Novak Druce Bove + Quigg LLP

(57) ABSTRACT

A memory circuit according to one embodiment of the present invention includes a clock driver and an ODT timer. The clock driver is configured to provide a system clock signal based on a root clock signal when the memory circuit is in a read mode, and is configured to stop providing the system clock signal when the memory circuit is not in the read mode. The ODT timer is configured to provide a system ODT signal when the memory circuit is not in the read mode, wherein the transition edge of the system ODT signal is aligned with the transition edge of the root clock signal.

8 Claims, 6 Drawing Sheets

MEMORY CIRCUIT AND CONTROL METHOD THEREOF

BACKGROUND OF THE INVENTION

1. Field of the Invention

The present invention relates to a memory circuit, and more particularly, to on-die termination operation of a memory circuit.

2. Description of the Related Art

During propagation on a transmission line, electrical signals are reflected when an end of the transmission line is reached. This signal reflection causes noise and hence reduces the signal integrity. In low frequency applications, the transmission lines and the interconnection between lines can be considered as a lumped circuit, and thus this signal reflection can be ignored. However, in high frequency applications, where signal integrity is critical, the signal reflection problem becomes severe. Accordingly, an impedance mismatch of the transmission line, or a termination of the electrical signal, can be utilized to reduce the signal reflection. There are several signal termination techniques that can be utilized. Among these signal termination techniques, the on-die termination (ODT) technique is often utilized in memory circuits.

ODT allows the termination resistors for impedance matching in the transmission line to be located inside a circuit chip rather than on a printed circuit board. Therefore, ODT technique exhibits advantages such as reduced use of board space due to the elimination of the external resistors and the improving of the signal integrity by having the termination closer to the input of the memory device.

The operation of ODT is controlled by the ODT signal provided by a memory circuit. FIG. 1 shows a block diagram of a conventional memory circuit. As shown in FIG. 1, the memory circuit 100 comprises a delay locked loop (DLL) module 101, a clock driver 102, an ODT counter 103 and a plurality of input/output (I/O) buffers 104. The DLL module 101 is configured to provide a root clock signal based on an external clock signal received via a clock input buffer 150. The clock driver 102 is configured to provide a system clock signal based on the root clock signal to the plurality of I/O buffers 104 through a clock tree 120. The ODT counter 103 is configured to provide a system ODT signal based on an external ODT signal received via an ODT input buffer 160 and the root clock signal to the plurality of I/O buffers 104 through an ODT tree 130.

FIG. 2 shows the signal waveforms of the memory circuit 100 shown in FIG. 1 during the ODT operation. As shown in FIG. 2, an external clock signal and an external ODT signal are provided to the memory circuit 100. The root clock signal is generated based on the external clock signal. The system clock signal is generated based on the root clock signal. The system ODT signal is generated based on the root clock signal and the external ODT signal. At the leaves of the clock tree 120, each of the I/O buffers receives both the system clock signal and the system ODT signal, wherein the system clock signal is used to control the timing by allowing the system ODT signal to pass or not. That is, the final ODT timing information is generated locally at each of the plurality of I/O buffers 104. As shown in FIG. 2, the system clock signal on the clock tree 120 continuously toggles during the ODT operation and thus the memory circuit 100 consumes a lot of power, which is undesirable for the memory circuit application.

SUMMARY OF THE INVENTION

To reduce the power consumption of the memory circuit during the ODT operation, the present invention provides embodiments of memory circuit and the control method thereof to stop the toggling of the system clock signal. Without the toggling of the system clock signal, the power consumption of the memory circuit during the ODT operation can be significantly reduced.

The memory circuit according to one embodiment of the present invention comprises a clock driver and an ODT timer. The clock driver is configured to provide a system clock signal based on a root clock signal when the memory circuit is in a read mode, and is configured to stop providing the system clock signal when the memory circuit is not in the read mode. The ODT timer is configured to provide a system ODT signal when the memory circuit is not in the read mode, wherein the transition edge of the system ODT signal is aligned with the transition edge of the root clock signal.

The memory circuit according to another embodiment of the present invention comprises a delay locked loop module, a clock driver, an ODT counter and an ODT timer. The delay locked loop module is configured to provide a root clock signal based on an external clock signal. The clock driver is configured to provide a system clock signal based on the root clock signal when the memory circuit is in a read mode, and is configured to stop providing the system clock signal when the memory circuit is not in the read mode. The ODT counter is configured to provide a root ODT signal based on an external ODT signal and the root clock signal when the memory circuit is not in the read mode. The ODT timer is configured to provide a system ODT signal based on the root ODT signal and the system clock signal when the memory circuit is not in the read mode.

The memory circuit according to another embodiment of the present invention comprises a clock tree and an ODT tree. The clock tree is configured to carry a system clock signal to a plurality of I/O buffers, wherein the system clock signal toggles when the memory circuit is in a read mode, and the system clock signal stops toggling when the memory circuit is not in the read mode. The ODT tree is configured to carry a system ODT signal to the plurality of I/O buffers, wherein the system ODT signal toggles when the memory circuit is not in the read mode.

The method for controlling a memory circuit according to one embodiment of the present invention comprises the steps of: providing a system clock signal based on a root clock signal when the memory circuit is in a read mode; and providing a system ODT signal with transition edge aligned with the root clock signal and suspending the step of providing the system clock signal when the memory circuit is not in the read mode.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 3:
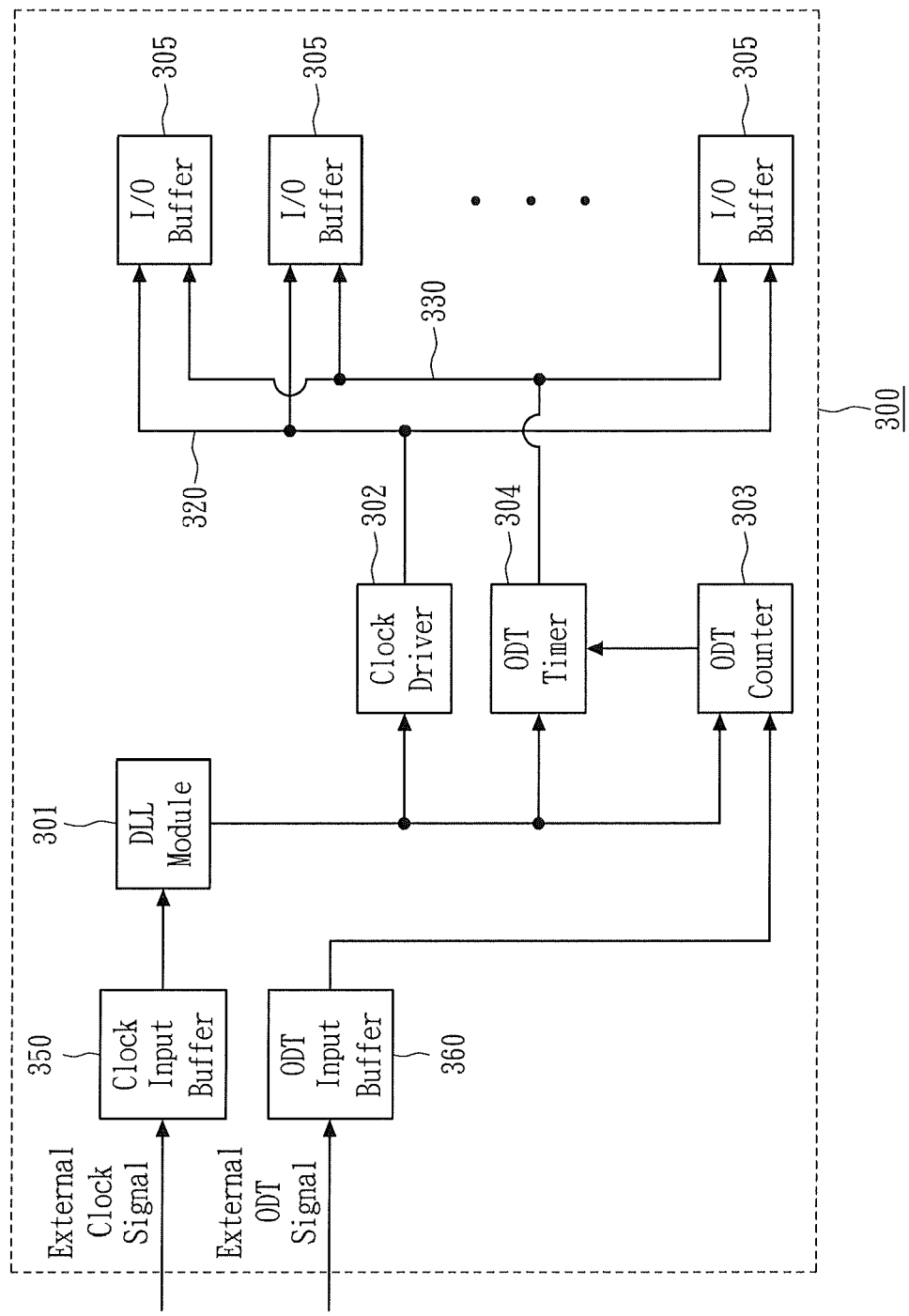
FIG. 3 shows the block diagram of a memory circuit according to an embodiment of the present invention.

FIG. 3 shows the block diagram of a memory circuit according to an embodiment of the present invention. As shown in FIG. 3, the memory circuit 300 comprises a DLL module 301, a clock driver 302, an ODT counter 303, an ODT timer 304 and a plurality of I/O buffers 305. The DLL module 301 is configured to provide a root clock signal based on an external clock signal received via a clock input buffer 350. The clock driver 302 is configured to provide a system clock signal based on the root clock signal to the plurality of I/O buffers 305 through a clock tree 320 when the memory circuit 300 is in a read mode, and configured to stop providing the system clock signal when the memory circuit 300 is not in the read mode. The ODT counter 303 is configured to provide a root ODT signal based on an external ODT signal received via an ODT input buffer 360 and the root clock signal when the memory circuit 300 is not in the read mode. The ODT timer 304 is configured to provide a system ODT signal based on the root ODT signal and the system clock signal to the plurality of I/O buffers 305 through an ODT tree 330 when the memory circuit 300 is not in the read mode.

Figure 1:
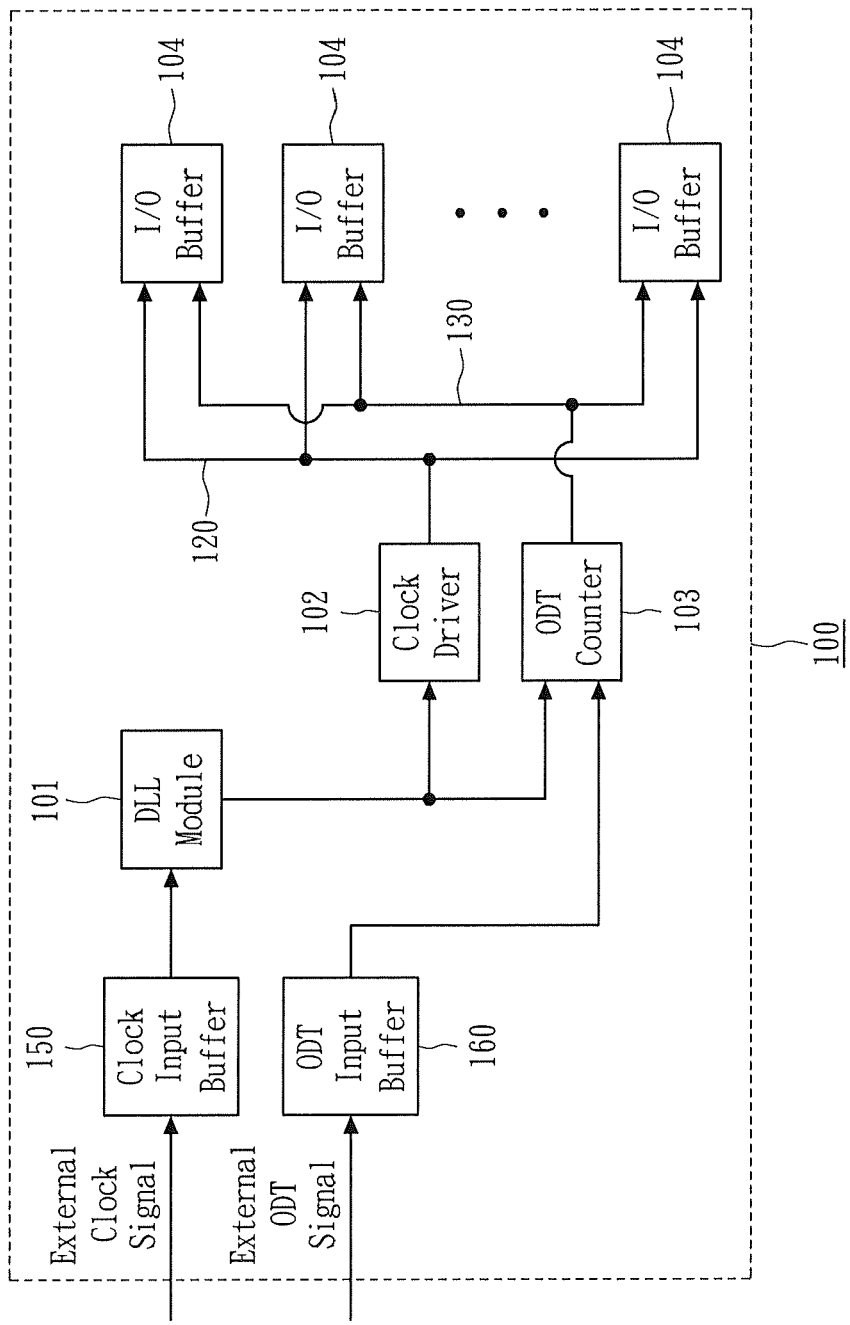
FIG. 1 shows the block diagram of a conventional memory circuit.
Figure 2:
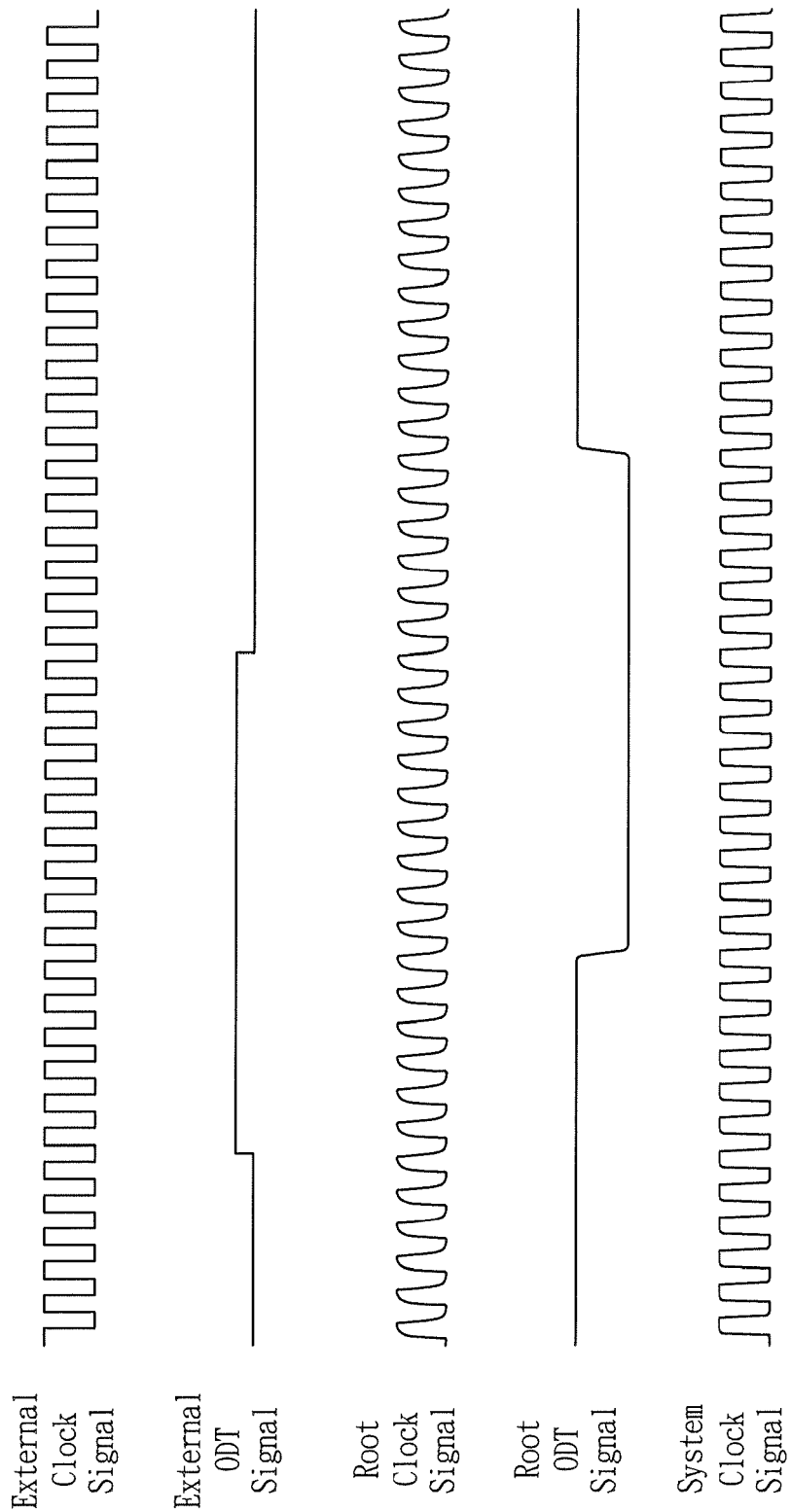
FIG. 2 shows the signal waveforms of a conventional memory circuit during the ODT operation.
Figure 4:
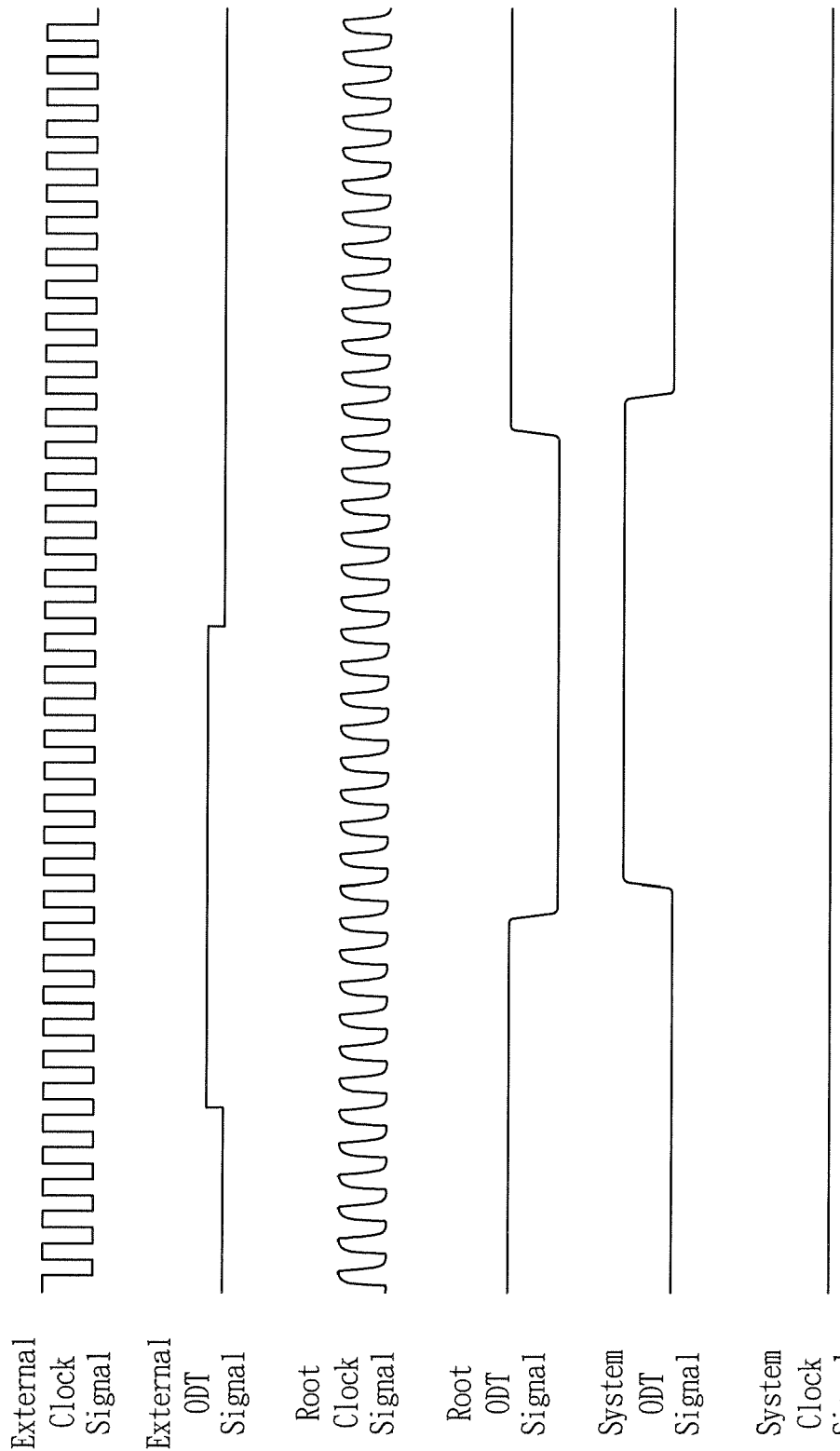
FIG. 4 shows the signal waveforms of a memory circuit according to an embodiment of the present invention during the ODT operation.

FIG. 4 shows the signal waveforms of the memory circuit 300 shown in FIG. 3 during the ODT operation. As shown in FIG. 4, an external clock signal and an external ODT signal are provided to the memory circuit 300. The root clock signal is generated based on the external clock signal. The system clock signal is generated based on the root clock signal. The root ODT signal is generated based on the root clock signal and the external ODT signal. The system ODT signal is generated based on the root clock signal and the root ODT signal. Unlike the memory circuit 100 shown in FIG. 1, the final ODT timing information, which in the signal waveforms shown in FIG. 4 is carried by the system ODT signal, is generated at the ODT timer 304. The system ODT signal then propagates through the ODT tree 330 to the plurality of I/O buffers 305 without the control of the system clock signal. Accordingly, as shown in FIG. 4, the toggling of the system clock signal on the clock tree 320 stops when the memory circuit 300 is not in the read mode. Therefore, while in the standby mode or the write mode, the clock tree 320 is turned off, and the system ODT signal propagating on the ODT tree 330 toggles at much lower frequency than the system clock signal since the system ODT signal only toggles on the edge of the external ODT signal. Since the system clock signal stops toggling when the memory circuit 300 is not in the read mode, a lot of power can be saved.

In some embodiments of the present invention, the root clock signal is sufficiently advanced from the system clock signal such that the toggling of the system ODT signal can be aligned with the edges of the system clock signal. In some embodiments of the present invention, the number of gates from the root of the ODT tree 330 to the leaves of the ODT tree 330 is configured to match the number of gates from the root of the clock tree 320 to the leaves of the clock tree 320. That is, the propagation time of the system ODT signal from the root of the ODT tree 330 to the leaves of the ODT tree 330 is configured to match the propagation time of the system clock signal from the root of the clock tree 320 to the leaves of the clock tree 320.

Figure 5:
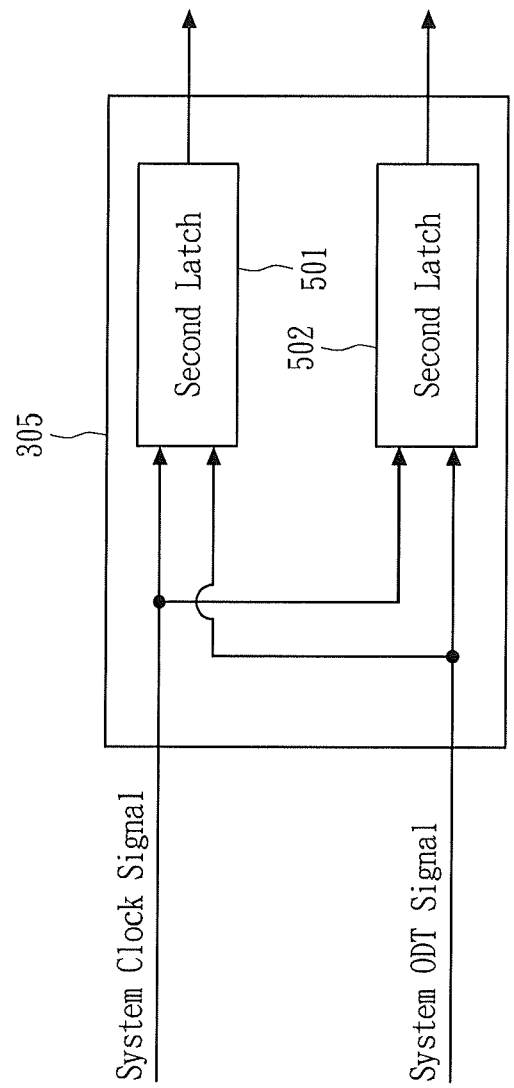
FIG. 5 shows the block diagram of an I/O buffer according to an embodiment of the present invention.

FIG. 5 shows the block diagram of one of the I/O buffers 305 according to an embodiment of the present invention. As shown in FIG. 5, the I/O buffer 305 comprises a first latch 501 and a second latch 502. The first latch 501 is configured to latch the rising edge of the system ODT signal when the system clock signal is high. The second latch 502 is configured to latch the falling edge of the system ODT signal when the system clock signal is low. Since during the standby mode and the write mode, the system clock signal is kept at low, the first latch 501 is always off, and the second latch 502 is always on. It should be noted that in this embodiment, the ODT tree 330 fans out to both the first latch 501 and the second latch 502 such that any discontinuity can be prevented once the system clock signal on the clock tree 320 resumes toggling. Such a case may occur when the ODT mode ends just before a read-burst appears at the I/O buffer 305. As soon as a valid read command is received by the memory circuit 300, the system clock signal on the clock tree 320 resumes toggling. If the external ODT signal is timed such that it turns off just before read data appears at the I/O buffer 305, the system clock signal on the clock tree 320 will start toggling before the termination actually turns off. In this case, the fan out of the ODT tree 330 prevents any discontinuity.

Figure 6:
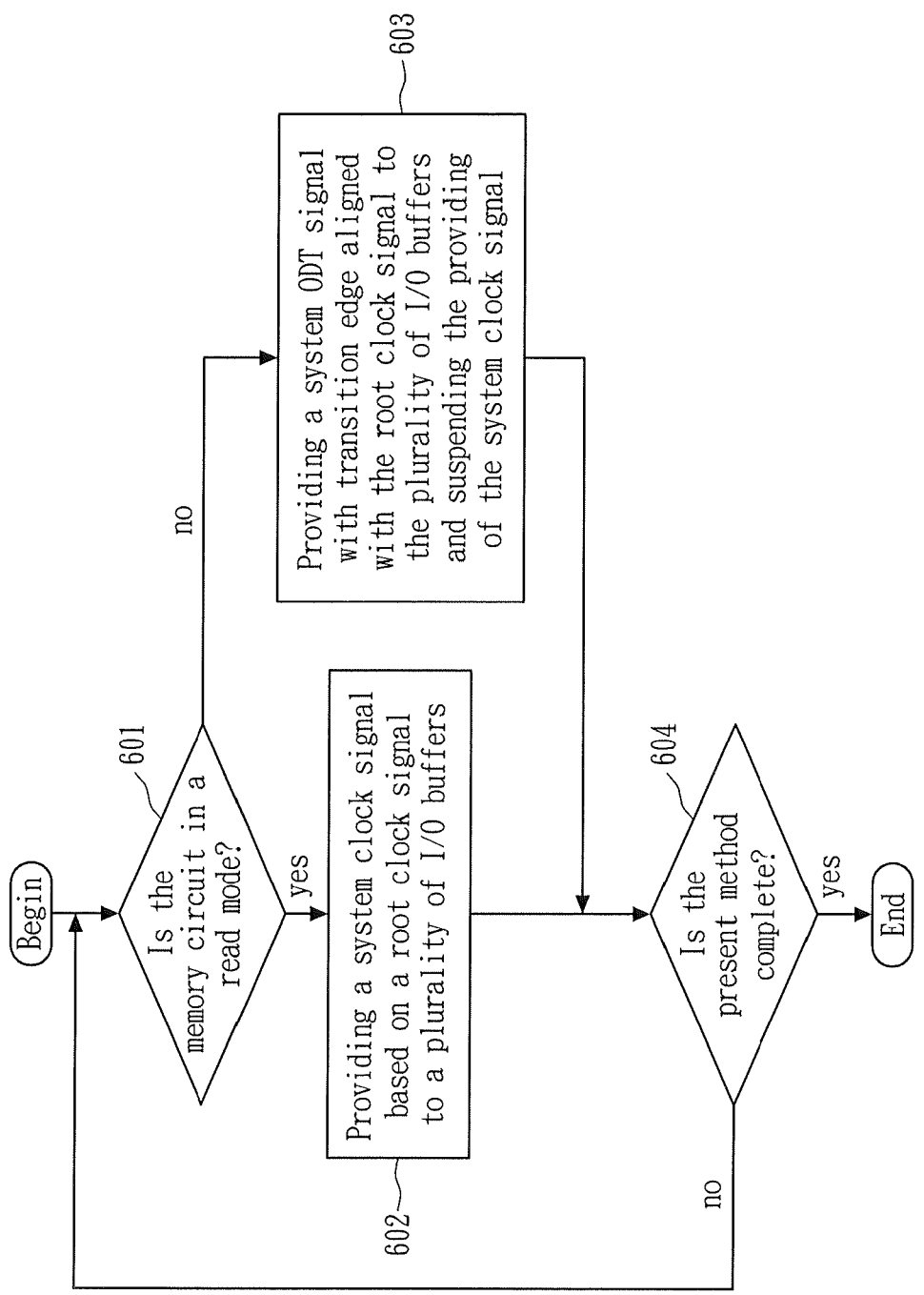
FIG. 6 shows a method for controlling a memory circuit according to an embodiment of the present invention.

FIG. 6 shows a method for controlling a memory circuit according to an embodiment of the present invention, wherein the method corresponds to the memory circuit provided by the embodiments of the present invention. In step 601, the mode of the memory circuit is checked. If the memory circuit is in a read mode, step 602 is executed; otherwise, step 603 is executed. In step 602, a system clock signal based on a root clock signal is provided to a plurality of I/O buffers, and step 604 is executed. In step 603, a system ODT signal with transition edge aligned with the root clock signal is provided to the plurality of I/O buffers, the providing of the system clock signal is suspended, and step 604 is executed. In step 604, it is checked whether the present method is complete. If the present method is not complete, step 601 is executed.

In conclusion, the present invention provides embodiments of memory circuit and the control method thereof such that the system clock signal is turned off during the ODT operation, wherein the final ODT information is generated at the root of the ODT tree rather than at the leaves of the ODT tree. Accordingly, the power consumption of the memory circuit during the ODT operation can be significantly reduced.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory circuit, comprising:
   a clock driver, configured to provide a system clock signal based on a root clock signal when the memory circuit is in a read mode, and configured to stop providing the system clock signal when the memory circuit is not in the read mode;
   an on-die termination (ODT) timer, configured to provide a system ODT signal when the memory circuit is not in the read mode, wherein the transition edge of the system ODT signal is aligned with the transition edge to of the root clock signal; and
   a plurality of input/output (I/O) buffers, configured to receive the system clock signal and the system ODT signal,
   wherein the signal propagation time from the ODT timer to the plurality of I/O buffers is configured to match the signal propagation time from the clock driver to the plurality of I/O buffers.

2. The memory circuit of Claim 1, wherein each of the I/O buffers comprises a first latch configured to latch the rising edge of the system ODT signal when the system clock signal is high, and a second latch configured to latch the falling edge of the system ODT signal when the system clock signal is low.

3. A memory circuit, comprising:
   a delay locked loop module, configured to provide a root clock signal based on an external clock signal;
   a clock driver, configured to provide a system clock signal based on the root clock signal when the memory circuit is in a read mode, and configured to stop providing the system clock signal when the memory circuit is not in the read mode;
   an on-die termination (ODT) counter, configured to provide a root ODT signal based on an external ODT signal and the root clock signal when the memory circuit is not in the read mode;
   an ODT timer, configured to provide a system ODT signal based on the root ODT signal and the system clock signal when the memory circuit is not in the read mode; and
   a plurality of input/output (I/O) buffers, configured to receive the system clock signal and the system ODT signal,
   wherein the signal propagation time from the ODT timer to the plurality of I/O buffers is configured to match the signal propagation time from the clock driver to the plurality of I/O buffers.

4. The memory circuit of claim 3, wherein each of the I/O buffers comprises a first latch configured to latch the rising edge of the system ODT signal when the system clock signal is high, and a second latch configured to latch the falling edge of the system ODT signal when the system clock signal is low.

5. A memory circuit, comprising:
   a clock tree, configured to carry a system clock signal to a plurality of input/output (I/O) buffers, wherein the system clock signal toggles when the memory circuit is in a read mode, and the system clock signal stops toggling when the memory circuit is not in the read mode;
   an on-die termination (ODT) tree, configured to carry a system ODT signal to the plurality of I/O buffers, wherein the system ODT signal toggles when the memory circuit is not in the read mode,
   wherein the signal propagation time from the ODT timer to the plurality of I/O buffers is configured to match the signal propagation time from a clock driver to the plurality of I/O buffers.

6. The memory circuit of claim 5 wherein each of the I/O buffers comprises a first latch configured to latch the rising edge of the system ODT signal when the system clock signal is high, and a second latch configured to latch the falling edge of the system ODT signal when the system clock signal is low.

7. The memory circuit of claim 5, wherein the signal propagation time from the root of the clock tree to the leaves of the clock tree is configured to match the signal propagation time from the root of the ODT tree to the leaves of the ODT tree.

8. A method for controlling a memory circuit, comprising the steps of:
   providing a system clock signal based on a root clock signal when the memory circuit is in a read mode;
   providing a system on-die termination (ODT) signal with transition edge aligned with the root clock signal and suspending the step of providing the system clock signal when the memory circuit is not in the read mode; and
   providing the system clock signal and the system ODT signal to a plurality of input/output (I/O) buffers,
   wherein the signal propagation time from an ODT timer to the plurality of I/O buffers is configured to match the signal propagation time from a clock driver to the plurality of I/O buffers.

* * * * *